US005565861A

United States Patent [19]
Mettler et al.

[11] Patent Number: 5,565,861
[45] Date of Patent: Oct. 15, 1996

[54] MULTIDIGIT COUNTING WHEEL MECHANISM FOR A VOLUME-MEASURING INSTRUMENT

[75] Inventors: Roland Mettler, Kriens; Dieter Vischer, Zug, both of Switzerland

[73] Assignee: GWF Gas-und Wassermesserfabrik AG, Luzern, Switzerland

[21] Appl. No.: 354,039

[22] Filed: Dec. 6, 1994

[30] Foreign Application Priority Data

Dec. 23, 1993 [CH] Switzerland .............. 03854/93

[51] Int. Cl.$^6$ .................................. G08B 23/00
[52] U.S. Cl. .............. 340/870.02; 341/173; 341/177; 341/178
[58] Field of Search ............ 340/870.02; 341/173, 341/177, 178

[56] References Cited

U.S. PATENT DOCUMENTS 3,732,404  5/1973  Jones .
4,031,386  6/1977  Recker .

FOREIGN PATENT DOCUMENTS

| 0119545 | 9/1984 | European Pat. Off. . |
| 0202722 | 11/1986 | European Pat. Off. . |
| 2244404 | 4/1974 | Germany . |
| 614776 | 12/1979 | Switzerland . |
| 2130828 | 6/1984 | United Kingdom . |

OTHER PUBLICATIONS

International Search Report and Annex.

*Primary Examiner*—John K. Peng
*Assistant Examiner*—Andrew Hill
*Attorney, Agent, or Firm*—Greenblum & Bernstein P.L.C.

[57] ABSTRACT

Multidigit counting wheel mechanism for a volume-measuring instrument. An absolute encoder for a measuring instrument includes a mechanical counting wheel mechanism consisting of five sensors, mounted in a plane perpendicular to a counting mechanism axle, for each counting wheel and a code, producing a digital rotary angle signal with a resolution of 12°, on each counting wheel, with the counting wheel mechanism being visually readable in a conventional manner, with the encoder not increasing the torque required for driving the counting mechanism.

22 Claims, 5 Drawing Sheets

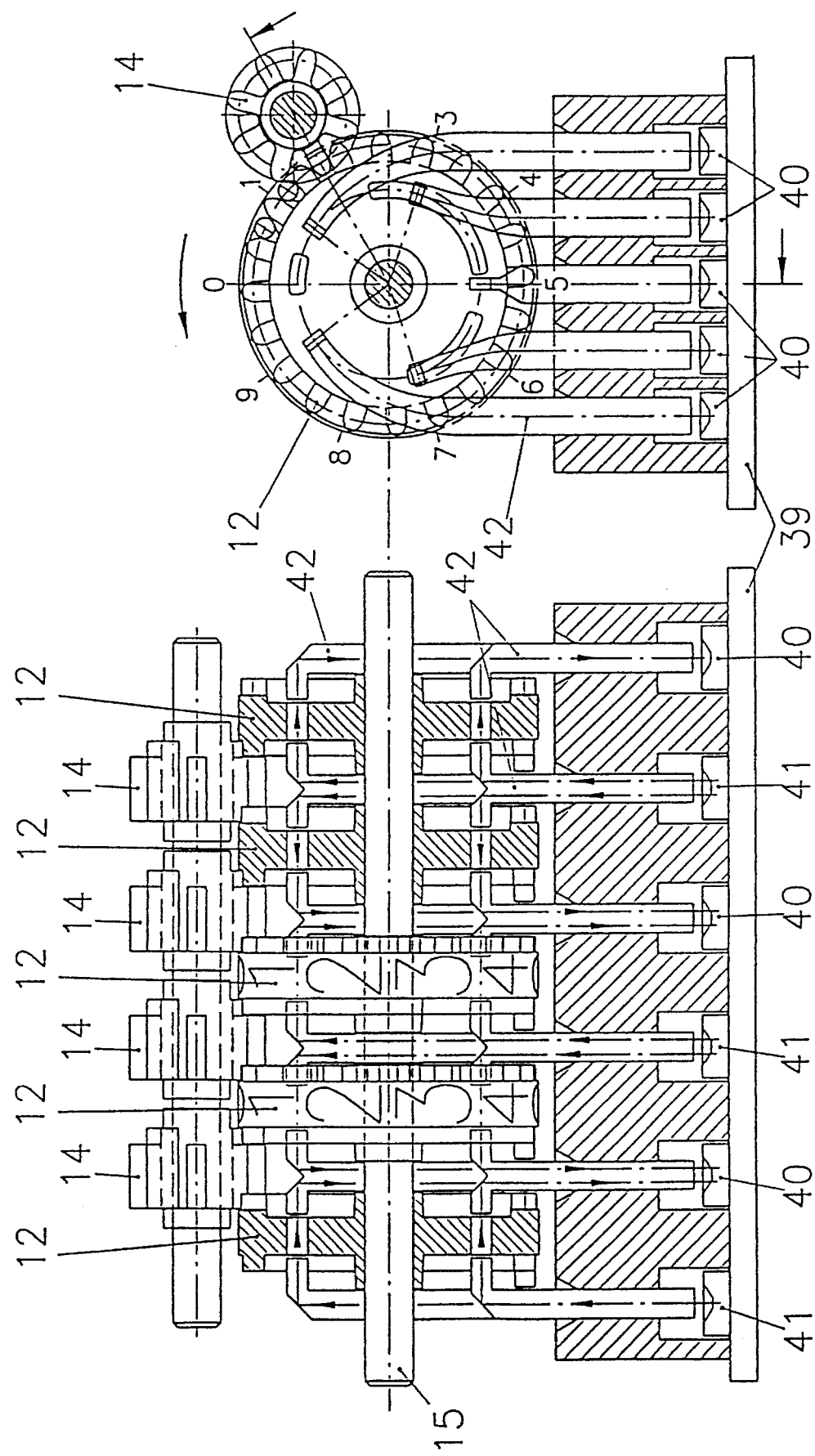

MULTIDIGIT COUNTING WHEEL MECHANISM FOR A VOLUME-MEASURING INSTRUMENT

CROSS REFERENCE TO RELATED APPLICATIONS

This application claims the priority of Swiss Application No. CH 03 854/93-0, filed Dec. 23, 1993, the disclosure of which is incorporated herein by reference in its entirety.

BACKGROUND OF THE INVENTION

1. Field of the Invention

Volume-measuring instruments are known for gas and water as well as electricity meters for the measurement of the energy that has flowed therethrough, in which the measured volume or the measured energy are transmitted to a mechanical counting wheel mechanism with a step-down ratio adapted to the measuring instrument. The counting wheel mechanism in that case indicates a quantity that has flowed therethrough since the last zero setting or since the commissioning or start-up of the instrument. In order to ascertain the consumption during a certain period, the state or setting of the counting wheel mechanism is read at both the beginning and the end of this period.

2. Discussion of the Background of the Invention and Material Information

A preferred construction for the counting wheel mechanism consists of an axle, on which the counting wheels are mounted so as to be rotatable with respect thereto and on the circumference of the wheels the numerals 0 to 9 are applied, as well as of a second axle having shift pinions rotatably mounted thereon in such a manner that the lower digit counting wheel, in the last tenth of a revolution, each time by way of the associated shift pinion, steps or advances the next higher digit wheel by one tenth of a revolution. A counting wheel mechanism for a water measuring instrument is set forth, for example, in German Patent Publication DE 22 44 404 A1. Depending upon the construction of the measuring instrument, it is important for the achievement of a wide measuring range, with good measuring accuracy, to keep the torque required for driving the counting wheel mechanism as small as possible.

A solution for the electronic read-out of a counting mechanism, in which the continuous rotational movement of the counting wheels is translated into snap movement, is set forth in U.S. Pat. No. 3,732,404. For this purpose, it must be assumed that the spring, or the like, used for the snap movement stores sufficient energy in order to turn the entire wheel counting mechanism or packet forward by one setting or step, for example, from 19,999 to 20,000. A solution, which permits the electronic read-out for a counting mechanism of the needle type, with the use of mechanical contacts without snap movement, is set forth in European Patent Publication EP 20 27 22 B1. Common to all of the above solutions is that an increase in torque is required for the drive of the counting wheel mechanism.

SUMMARY OF THE INVENTION

The present invention has the task or object to digitally electronically read out the state of indication or setting of a counting wheel mechanism in a measuring instrument with the simplest possible means at any desired instant without the torque, required for the drive of the counting wheel mechanism, being substantially changed by the means necessary for this purpose.

According to the present invention, the indicated state of a mechanical counting wheel mechanism is electronically read out by means of suitable, fixedly arranged, contactless sensors without restrictive conditions, such as for example a snap rotation, having to be fulfilled with respect of the rotational movement of the counting wheel mechanism. In order to reliably read out, with the use of static sensors, the indication of a non-snap counting wheel mechanism in all settings and subject to consideration of the mechanically necessary play of the wheel drive, it is required that the sensor assume at least 22 different signal states for each revolution of the counting wheel. Thereby, it is possible to measure the angle of rotation of each counting wheel with an uncertainty of less than 18° and to ascertain the relative setting of two adjacent wheels with an uncertainty of less than 36° and thus to reliably ascertain the state of indication of the counting wheel mechanism. In a preferred solution, the sensors assume 30 different signal states for each revolution, symmetrically distributed at an angle of rotation of the counting wheel of 12° for each signal state. With this solution, mechanical play, from counting wheel to counting wheel, of up to almost 12° is permissible, independently of the number of the counting wheels to be read out. A requirement of the signal state, which is generally known from applications for the detection of a mechanical position with several sensors, is that only one signal changes each time from state to state in the manner of a Gray code.

Specifically, one embodiment of this invention pertains to a multidigit counting wheel mechanism for a volume-measuring instrument including gas, water and electric meters, the mechanism comprising a plurality of rotatable counting wheels mounted on an axle and provided with multiple peripheral digits; a plurality of rotatable shift pinions operatively connected with pairs of the counting wheels; wherein in each of two adjacent counting wheels, the adjacent higher digit counting wheel is turned further through one tenth or a revolution, via an associated shift pinion, by the adjacent lower digit counting wheel in the last tenth of the revolution of the latter; five contactless sensors, for each of the plurality of counting wheels to be read, mounted in a diametral manner, in a plane perpendicular to the counting wheel axle; and a plurality of codes, consisting of three segments of a first kind and of three segments of a second kind, mounted on the counting wheels in a manner that the five sensors can generate thirty different signal states during one complete revolution of a counting wheel.

A further embodiment of this invention includes a binary code, consisting of multiple segments of a first kind and of multiple segments of a second kind, mounted on each counting wheel to be read.

In another embodiment of this invention, the plurality of codes consist of unequal length segments arranged on a circular arc.

In an additional embodiment of this invention, the sensors are all arranged on a circular arc, at equal radial spacing from the counting wheel axle.

In yet a further embodiment of this invention, the sensors are optical sensors.

In a variation of the previous embodiment, the optical sensors are photo detectors and form part of a one-way light barrier.

In still a further embodiment of this invention, the sensors are capacitive sensors.

In a final embodiment of this invention, the five capacitive sensors are constructed as narrow metallized sensor platelets and one of a code disc and a code cylinder, one of which includes metallic segments while the other includes non-metallic segments in alternation, with one of the code disc and the code cylinder being disposed in the immediate proximity of the sensor platelets, and the capacitance being measured between the sensor platelets and an electrically conductive inner ring.

BRIEF DESCRIPTION OF THE DRAWINGS

The invention will be better understood and objects other than those set forth above will become apparent when consideration is given to the following detailed description thereof. Such description makes reference to the annexed drawings wherein throughout the various figures of the drawings, there have generally been used the same reference characters to denote the same or analogous components. Several embodiments of the invention are illustrated in the drawings and more closely explained in the following description, wherein:

FIGS. 3a to 3k show all possible codes for the third embodiment of this invention;

FIG. 4a, which shows a fourth embodiment of this invention, is a partial sectional view, taken along line 4a—4a of FIG. 4b;

FIG. 4b is an end view of the FIG. 4a embodiment;

DETAILED DESCRIPTION OF THE PREFERRED EMBODIMENTS

With respect to the drawings it is to be understood that only enough of the construction of the invention and the surrounding environment in which the invention is employed have been depicted therein, in order to simplify the illustrations, as needed for those skilled in the art to readily understand the underlying principles and concepts of the invention.

Figures 1A, 1B:
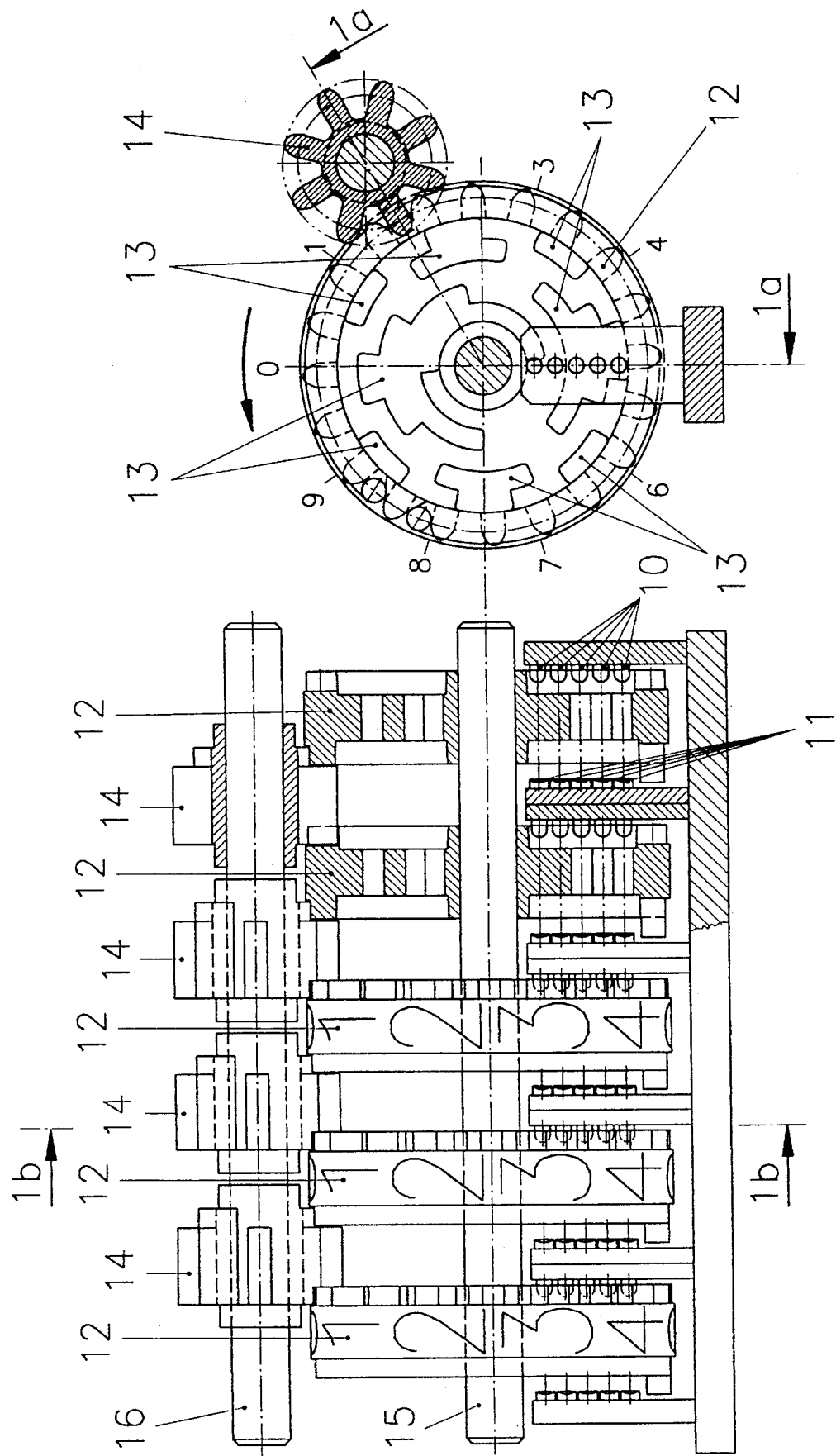
FIG. 1a, which shows a first embodiment of this invention, is a partial sectional view, taken along line 1a—1a of FIG. 1b.
FIG. 1b is a partial sectional view, taken along line 1b—1b, of the FIG. 1a embodiment.

The first embodiment of this invention (FIGS. 1a, 1b) operates with one-way light barriers which display optical sensors. A plurality of counting wheels 12, operatively mechanically interconnected with each other by way of "shift" pinions 14, are rotatably mounted on a counting wheel axle 15. The "shift" pinions 14 are rotatably mounted on a "shift" pinion axle 16. The counting wheels 12 are visually readable in a conventional manner through a non-illustrated opening. For electronic read-out, five light sources 10 at one side, and five sensors or light receivers 11 at the other side, are arranged laterally of the counting wheels 12, each time at a different radial spacing. A suitable multitrack binary code 13 (FIG. 1b), which consists of translucent and opaque segments (FIG. 1a), is disposed at each counting wheel 12. Due to the inevitably small spacing of the individual code tracks, this solution makes high demands on the accuracy of the sensors and the code on the counting wheels.

Figure 2B:
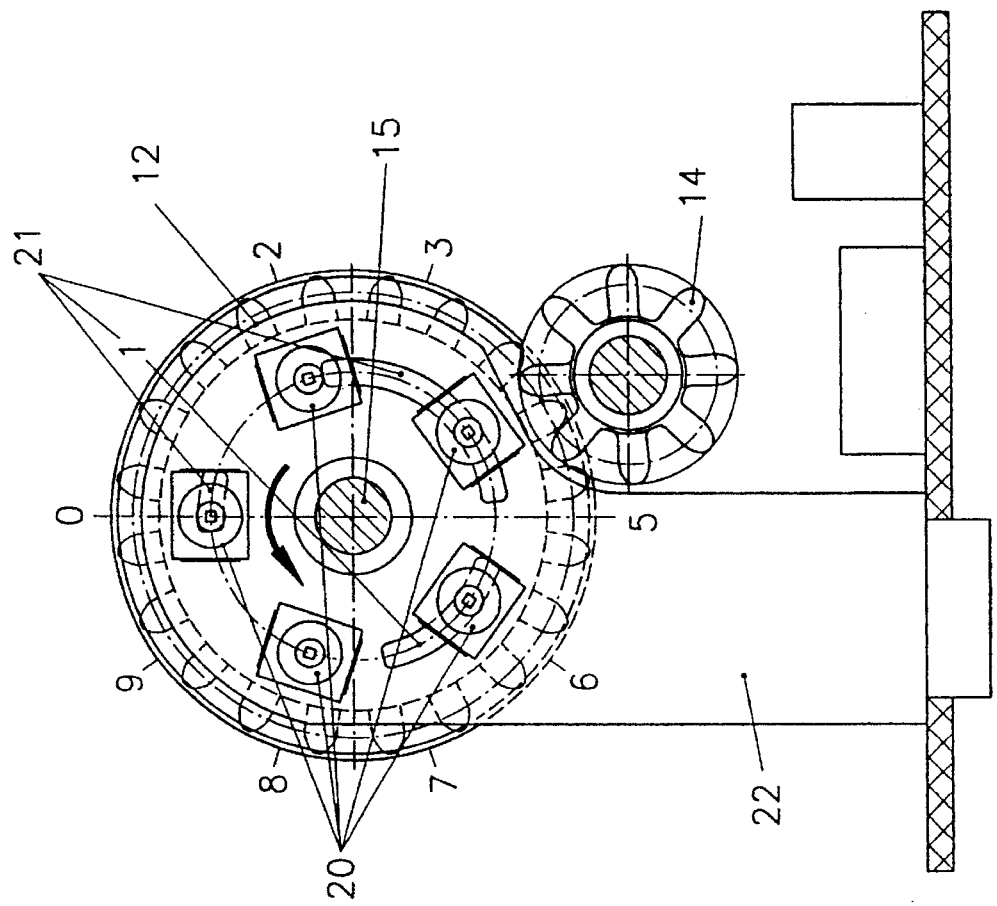
FIG. 2b is an end view of a third embodiment of this invention.
Figure 2A:
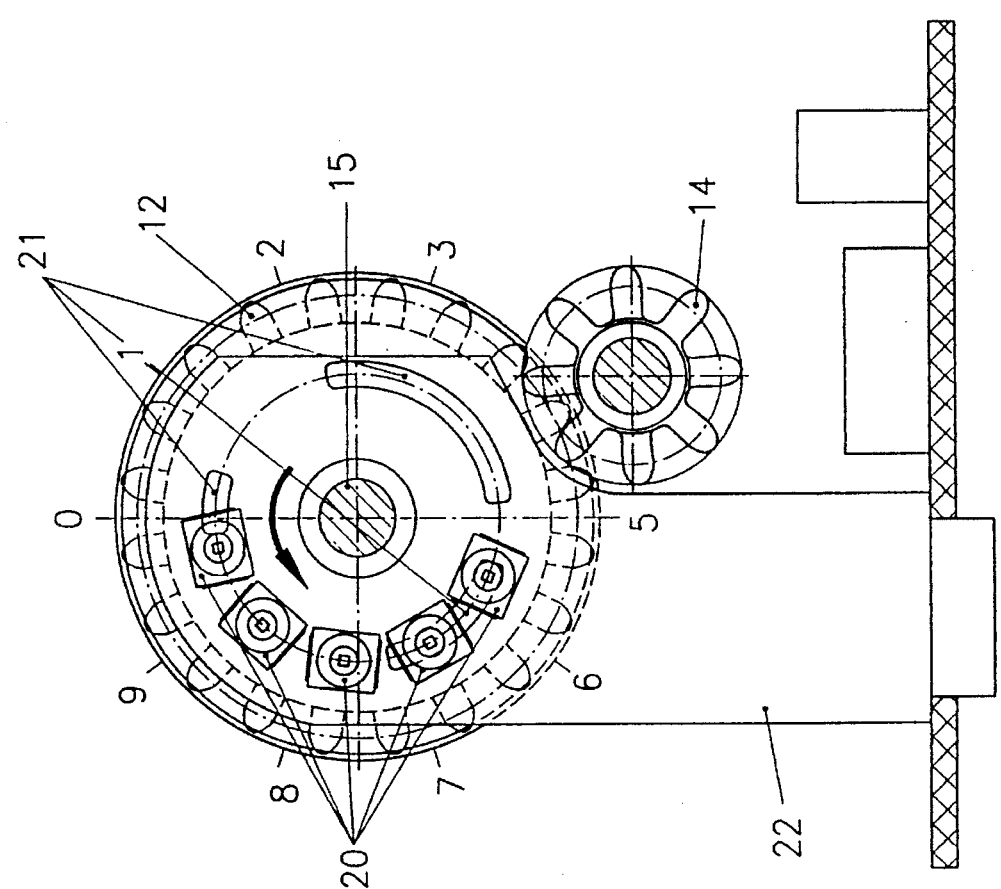
FIG. 2a is an end view of a second embodiment of this invention.

According to the second embodiment of this invention, (FIG. 2a), five sensors 20 are likewise used for each counting wheel 12, which as in the first embodiment are components of one-way light barriers. The sensors 20 are applied on a sensor print 22, all at equal radial spacings on a circular arc about the counting wheel axle 15 and in one radial plane. For a rational assembly, it is advantageous to mount all five sensors 20 as closely, one beside the other, as possible, in one half of the periphery of the counting wheels 12. This is provided in an arrangement of angles of 36° each, between the five sensors 20 (FIG. 2a).

For the most reliable construction of the encoder, it is advantageous in the thirty used signal states not to consider the states "1 1 1 1 1" (all sensors on) and "0 0 0 0 0" (all sensors off) so that a global test of the sensor function is possible. For this purpose, the five sensors 20 are uniformly arranged and distributed at angles of 72° over the entire circumference (FIG. 2b). Other possible constructions utilize arrangements of sensors 20 at angles of 72°, 36°, 36°, 72° or 36°, 72°, 36°, 108°.

All possible codes 21 on counting wheels 12 are illustrated in the FIGS. 3a, 3b, 3c, 3d, 3e, 3f, 3g, 3h, 3i and 3k. They consist of three segments of a first kind 31 alternating with three segments of a second kind 32. The six dividing lines between segments 31 and 32 of code 21 are arranged on counting wheels 12 at the following angles:

Variation a: 18°, 78°, 174°, 198°, 258°, 354°
Variation b: 18°, 42°, 78°, 126°, 246°, 354°
Variation c: 18°, 42°, 78°, 198°, 318°, 354°
Variation d: 18°, 54°, 174°, 258°, 294°, 354°
Variation e: 18°, 42°, 150 °, 198°, 246°, 354°
Variation f: 18°, 54°, 102°, 150°, 258°, 354°
Variation g: 18°, 54°, 114°, 150°, 246°, 354°
Variation h: 18°, 54°, 150°, 186°, 246°, 354°
Variation i: 30°, 78°, 114°, 162°, 270°, 354°
Variation k: 30°, 78°, 126°, 162°, 258°, 354°

Figure 3A:
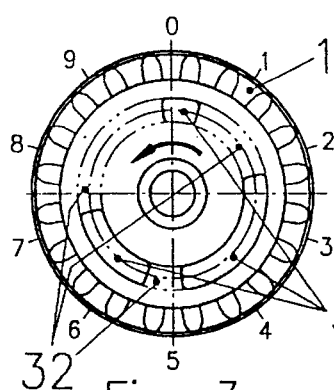
Figure 3B:
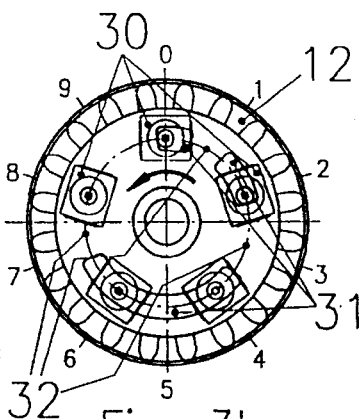
Figure 3C:
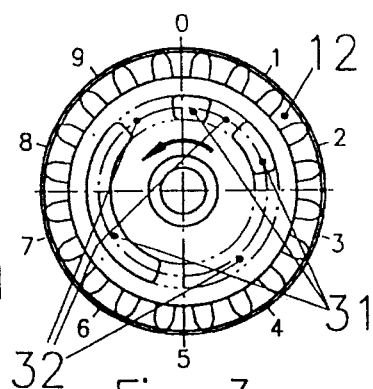
Figure 3D:
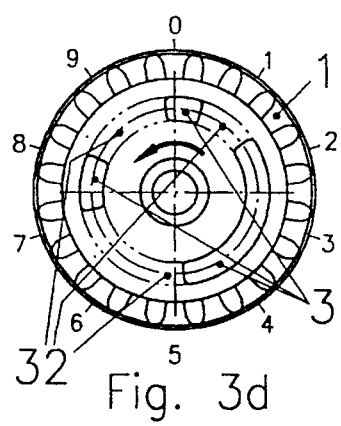
Figure 3E:
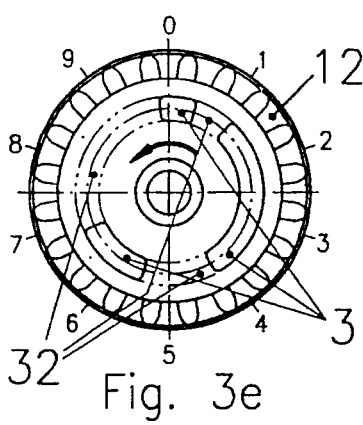
Figure 3F:
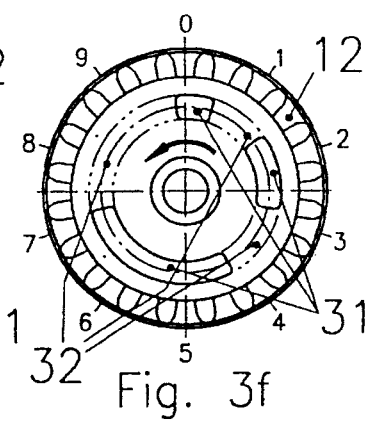
Figure 3G:
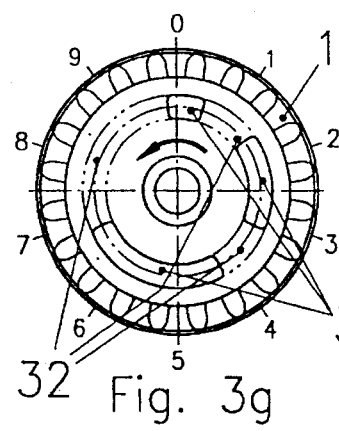
Figure 3H:
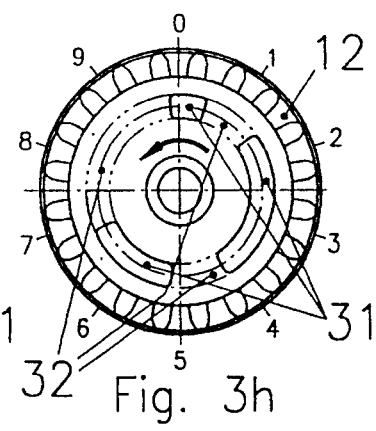
Figure 3I:
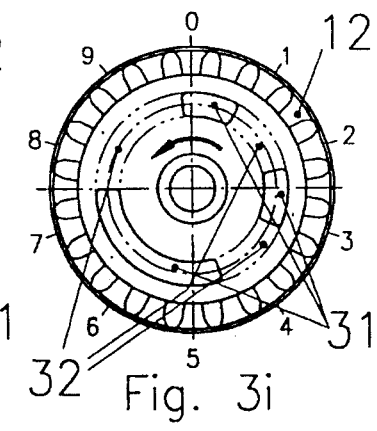
Figure 3K:
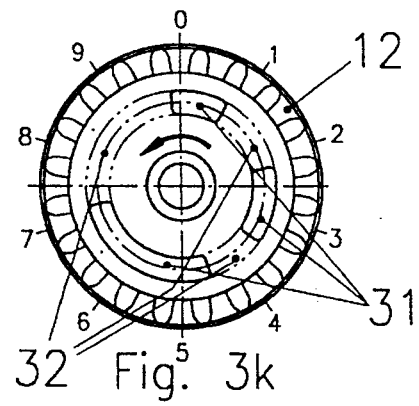

The variations b to k are usable only for sensors 30 distributed in radial symmetry, which means a distribution at equal angles between the sensors (see sensors 20 in FIG. 2b). Codes 21 can also be rotated or reflected. In FIG. 3b, the five sensors 30 are also shown by way of example. With the use of one-way light barriers, the segments of the first kind are formed by holes or apertures and the segments of the second kind consist of webs. The use of reflective light barriers would also be feasible, when the segments of the first kind can be distinguished clearly in their reflective properties from those of the second kind.

A structuring of optical sensors, which is advantageous for the production of greater numbers, consists of photoelectric elements 40 and 41, arranged parallel to axle 15 of counting wheels 12, on a print 39. Elements 41 act as light sources, the light of which is conveyed by molded optical conductors 42 to the code-carrying part of the counting wheel 12 (FIGS. 4a, 4b). Elements 40 are optical sensors, for example photo-resistors. The arrows on the beams emanating from the optical conductors always indicate the beam direction of the light.

Figures 5A, 5B, 5C:
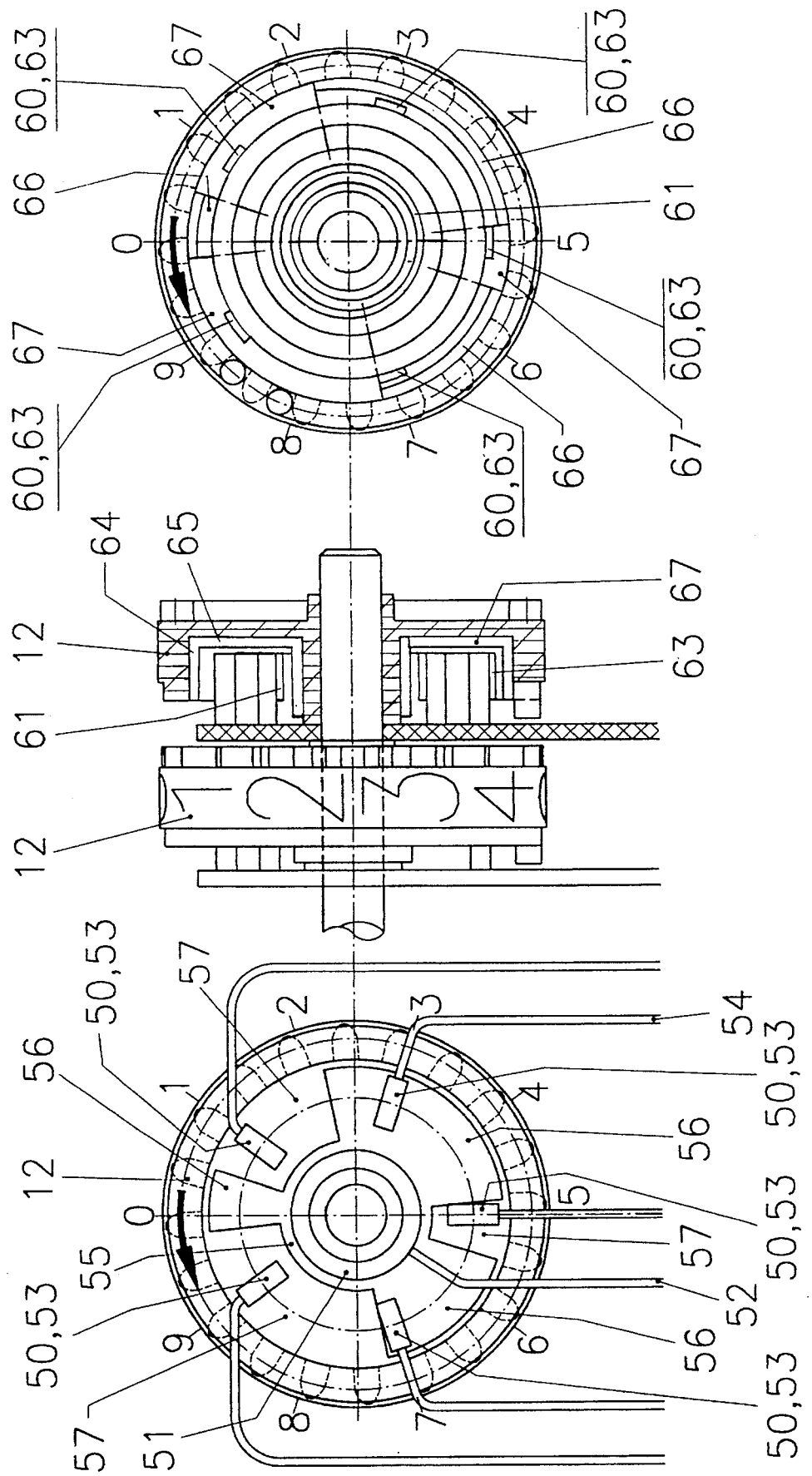
FIG. 5a shows a fifth embodiment of this invention.
FIG. 5b is a partial elevational view of a sixth embodiment of this invention.
FIG. 5c is a cross-sectional view of the FIG. 5b embodiment.

Another inexpensive sensor variation, shown in a fifth embodiment of this invention, is equipped with capacitive sensors 50 (FIG. 5a). An electrically conductive inner ring 51, with terminal 52, is mounted parallel to the counting wheel 12 and close to its axis. The sensors, which are stationary relative to the counting wheels 12, consist of five narrow sensor platelets 53, which ar provided at equal angular spacings, with electrical terminals 54. Inner ring 51 and sensor platelets 53 are arranged in a radial plane, preferably on an insulating plate, and at a small radial spacing from counting wheel 12. Counting wheel 12 carries a code disc 55 with three conducting segments 56 and three non-conducting segments 57. To ascertain the setting of a counting wheel, the capacitance between inner ring 51 and individual sensor platelet 53 is measured at terminals 52 and 54.

FIGS. 5b and 5c likewise, in a sixth embodiment of this invention, show a capacitive variation with sensor 60 in radial arrangement. The capacitances are measured, each time, between a metallic inner cylinder 61 and five narrow sensor platelets 63, spaced radially therefrom. Counting wheel 12 displays a code cylinder 65 with metallic and non-metallic segments (66, 67) respectively, in alternating positions laterally in an annular groove 64. In this embodiment code cylinder 65 does not lie between sensor platelets 63 and inner ring or cylinder 61, but closely enough to sensor platelets 63 for the measured capacitance to be sufficiently influenced.

Instead of using capacitive sensors, appropriately constructed inductive sensors can be used equally well.

While there are shown and described present preferred embodiments of the invention, it is to be distinctly understood that the invention is not limited thereto, but may be otherwise variously embodied and practiced within the scope of the following claims and the reasonably equivalent structures thereto. Further, the invention illustratively disclosed herein may be practiced in the absence of any element which is not specifically disclosed herein.

What is claimed is:

1. A multidigit counting wheel mechanism for a volume-measuring instrument including gas, water and electric meters, the mechanism comprising:

a plurality of rotatable counting wheels mounted on an axle and provided with multiple peripheral digits;

a plurality of rotatable shift pinions operatively connected with pairs of said counting wheels;

wherein in each of two adjacent counting wheels, the adjacent higher digit counting wheel is turned further through one tenth of a revolution, via an associated shift pinion, by the adjacent lower digit counting wheel in the last tenth of the revolution of the latter;

five contactless sensors, for each of said plurality of counting wheels to be read, said sensors radially mounted in a plane perpendicular to said counting wheel axle to be equidistant from each other and from said counting wheel axle; and a plurality of codes, consisting of three segments of a first kind and of three segments of a second kind, mounted on the counting wheels in a manner that said five sensors can generate thirty different signal states during one complete revolution of a counting wheel.

2. The multidigit wheel display mechanism of claim 1, said plurality of codes comprising a binary code, said binary code being defined by a predetermined arrangement of said three segments of said first kind and said three segments of said second kind.

3. The multidigit wheel display mechanism of claim 1, wherein the plurality of codes consist of unequal length segments arranged on a circular arc.

4. The multidigit wheel display mechanism of claim 2, wherein the plurality of codes consist of unequal length segments arranged on a circular arc.

5. A multidigit counting wheel mechanism for a volume-measuring instrument including gas, water and electric meters, the mechanism comprising:

a plurality of rotatable counting wheels mounted on an axle and provided with multiple peripheral digits;

a plurality of rotatable shift pinions operatively connected with pairs of said counting wheels;

wherein in each of two adjacent counting wheels, the adjacent higher digit counting wheel is turned further through one tenth of a revolution, via an associated shift pinion, by the adjacent lower digit counting wheel in the last tenth of the revolution of the latter;

five contactless sensors, for each of said plurality of counting wheels to be read, each of said sensors comprising a source output for transmitting optical energy and a receiver input for receiving optical energy, wherein said source output and said receiver input are positioned on opposing sides of said counting wheel; and a plurality of codes, consisting of three segments of a first kind and of three segments of a second kind, mounted on the counting wheels in a manner that said five sensors can generate thirty different signal states during one complete revolution of a counting wheel.

6. The multidigit counting wheel mechanism of claim 5, wherein said sensors are arranged such that each of said five source outputs are linearly disposed along a radius of said counting wheel and that each of said five receiver inputs are linearly disposed opposite said source outputs and on an opposite side of said counting wheel.

7. The multidigit counting wheel mechanism of claim 5, each of said source outputs are radially arranged in a circular arc at equal radial spacing from said counting wheel axle on a first side of said counting wheel and each of said receiver inputs are radially arranged to correspond with each of said source outputs on a second side of said counting wheel.

8. The multidigit counting wheel mechanism of claim 5, each of said sensors further comprising a light source and a light receiver, wherein for each sensor, said light source is coupled to said source output and said light receiver is coupled to said receiver input.

9. The multidigit counting wheel mechanism of claim 8, wherein each of said light sources and each of said light receivers are disposed in a plane parallel to said axle of said plurality of counting wheel.

10. The multidigit counting wheel mechanism of claim 9, wherein said source outputs are radially mounted in a plane parallel to said counting wheel on a first side of said counting wheel and said receiver inputs are radially mounted in a plane parallel to said counting wheel, opposite corresponding source outputs, and on a second side of said counting wheel.

11. The multidigit counting wheel mechanism of claim 10, said source outputs being coupled to said light source through a first optical fiber and said receiver inputs being coupled to said light receiver through a second optical fiber.

12. The multidigit counting wheel mechanism of claim 5, said receiver input comprising a photodetector, and said sensor output and said receiver input form a one-way light barrier.

13. The multidigit counting wheel mechanism of claim 5, said plurality of codes comprising a binary code, said binary code being defined by a predetermined arrangement of said three segments of said first kind and said three segments of said second kind.

14. A multidigit counting wheel mechanism for a volume-measuring instrument including gas, water and electric meters, the mechanism comprising:

a plurality of rotatable counting wheels mounted on an axle and provided with multiple peripheral digits;

a plurality of rotatable shift pinions operatively connected with pairs of said counting wheels;

wherein in each of two adjacent counting wheels, the adjacent higher digit counting wheel is turned further through one tenth of a revolution, via an associated shift pinion, by the adjacent lower digit counting wheel in the last tenth of the revolution of the latter;

five contactless sensors, for each of said plurality of counting wheels to be read, wherein said sensors are radially positioned equidistant from said counting wheel axle, each said sensor comprising a transducer electrically coupled to an exterior surface of said counting wheel; and a plurality of codes, consisting of three segments of a first kind and of three segments of a second kind, mounted on said exterior surface of said counting wheels in a manner that said five sensors can generate thirty different signal states during one complete revolution of a counting wheel.

15. The multidigit counting wheel mechanism of claim 14, said plurality of codes comprising a binary code, said binary code being defined by a predetermined arrangement of said three segments of said first kind and said three segments of said second kind.

16. The multidigit counting wheel mechanism of claim 14, said sensors further being coplanarly arranged parallel to said counting wheel and comprising capacitive sensors.

17. The multidigit counting wheel mechanism of claim 14, said exterior surface comprising two concentric ring members, said sensors further comprising a hollow circular member extending to position that said hollow circular member coaxially between said two concentric ring members.

18. The multidigit counting wheel mechanism of claim 17, said sensors comprising capacitive sensors with metallic and non-metallic surfaces positioned on an outer face of said hollow circular member and said plurality of codes comprising metallic and non-metallic surfaces positioned on an inner face of an outer ring of said two concentric ring members.

19. The multidigit counting wheel mechanism of claim 18, said mechanism further comprising a metallic surface positioned on an inner face of said hollow circular member and a metallic surface positioned on an outer face of an inner ring of said two concentric ring member.

20. The multidigit counting wheel mechanism of claim 18, a gap formed between said capacitive sensors and said plurality of codes being approximately 1 mm.

21. The multidigit counting wheel mechanism of claim 18, said metallic surfaces equidistantly spaced about a periphery of said outer face of said hollow circular member.

22. The multidigit wheel display mechanism of claim 14, said sensors comprising narrow metallized sensor platelets and said plurality of codes comprising one of a code disc and a code cylinder, said one including metallic segments and the other including noncontinuous non-metallic segments, said one of said code disc and said code cylinder being disposed in the immediate proximity of said sensor platelets, and said capacitance measured between said sensor platelets and an electrically conductive inner ring.

* * * * *